United States Patent
Barth et al.

(10) Patent No.: US 6,730,982 B2
(45) Date of Patent: May 4, 2004

(54) FBEOL PROCESS FOR CU METALLIZATIONS FREE FROM AL-WIREBOND PADS

(75) Inventors: Hans-Joachim Barth, Munich (DE); Petra Felsner, Munich (DE); Erdem Kaltalioglu, Wappingers Falls, NY (US); Gerald Friese, München (DE)

(73) Assignee: Infineon Technologies AG, Munich (DE)

( * ) Notice: Subject to any disclaimer, the term of this patent is extended or adjusted under 35 U.S.C. 154(b) by 104 days.

(21) Appl. No.: 09/820,900

(22) Filed: Mar. 30, 2001

(65) Prior Publication Data

US 2002/0142592 A1 Oct. 3, 2002

(51) Int. Cl.[7] ................................. H01L 29/00
(52) U.S. Cl. .................. 257/529; 438/687; 438/686; 438/623; 438/601; 257/762; 257/763
(58) Field of Search ..................... 438/628, 687, 438/688, 601, 674, 678, 686, 623, 624; 257/529, 762, 763, 768, 769

(56) References Cited

U.S. PATENT DOCUMENTS

| | | |
|---|---|---|
| 4,005,472 A | 1/1977 | Harris et al. |
| 4,717,591 A | 1/1988 | Acosta et al. |
| 5,795,819 A | 8/1998 | Motsiff et al. ............. 438/618 |
| 6,054,380 A | 4/2000 | Naik ........................ 438/624 |
| 6,069,066 A | 5/2000 | Huang et al. |
| 6,071,808 A | 6/2000 | Merchant et al. |
| 6,180,505 B1 * | 1/2001 | Uzoh ........................ 438/614 |
| 6,187,680 B1 | 2/2001 | Costrini et al. ............. 438/688 |
| 6,323,128 B1 * | 11/2001 | Sambuccetti et al. ....... 438/678 |
| 6,375,159 B2 * | 4/2002 | Daubenspeck et al. ..... 251/529 |
| 6,440,833 B1 * | 8/2002 | Lee et al. .................. 438/601 |
| 6,440,834 B2 * | 8/2002 | Daubenspeck et al. ..... 438/601 |
| 6,455,913 B2 * | 9/2002 | Yeh et al. .................. 257/529 |
| 2001/0022403 A1 | 9/2001 | Lee et al. |
| 2001/0042897 A1 | 11/2001 | Yeh et al. |
| 2002/0084507 A1 * | 7/2002 | Barth ......................... 257/529 |
| 2002/0142592 A1 | 10/2002 | Barth et al. |

* cited by examiner

*Primary Examiner*—Caridad Everhart

(57) ABSTRACT

A process of making an interconnection structure of Cu FBEOL semiconductor devices that does not rely upon Al-wirebond pads which require additional patterning steps (for Al-via to Cu, Al-pad), including:

a) providing a substrate having Cu wires and Cu pads embedded therein;

b) selectively depositing a first metallic passivation layer on the top copper surfaces sufficient to prevent Cu oxidation and/or Cu out diffusion;

c) depositing a final passivation layer;

d) employing lithography and etching of the final passivation layer to cause pad opening of the fuses by exposing the passivated Cu in the bond pad area and in the fuse area; and e) causing additional passivation of open pad and open fuse areas by selective immersion deposition of Au.

16 Claims, 1 Drawing Sheet

FBEOL PROCESS FOR CU METALLIZATIONS FREE FROM AL-WIREBOND PADS

BACKGROUND OF THE INVENTION

1. Field of Invention

The present invention relates to preparing FBEOL (FAR-BACK-END-OF-LINE) copper metallizations for use in semiconductors without relying on additional Al-wirebond pads by: a process of probing, bonding, and fusing with only one patterning step for the final passivation opening; or a process of probing, bonding, fusing and flip chip bumping with two patterning steps—wherein both processes eliminate the Al-via+Al-pad patterning.

2. Description of the Related Art

It is known in semi-conductor manufacturing that a fabricated integrated circuit (IC) device is assembled into a package for use on a printed circuit board as part of a larger circuit. For leads of the package to make electrical contact with the bonding pads of the fabricated IC device, a metal bond is formed to make a connection between the bonding pad of the IC device and a lead extending to the package lead frame, or a solder ball connection to a ceramic or polymeric chip carrier.

Historically, Al and Al alloys are used as conventional chip wiring materials. However, it is desirous to replace Al wiring material with Cu and Cu alloys since Cu wiring would provide improved chip performance and superior reliability compared to Al and alloys of Al. Nevertheless, the packaging of IC devices utilizing copper wiring presents a considerable number of technical issues and challenges related to the reaction of copper with material used in the solder-ball process and/or the susceptibility of copper to attack and corrosion.

Current FEOL or BEOL practices for Cu metallization continue to rely on additional Al-wirebond pads. This reliance means that when currently preparing FEOL or BEOL processes for Cu metallization, additional patterning steps for Al-via to Cu Al-pad patterning is required, in addition to the opening of the final passivation.

U.S. Pat. No. 6,187,680 disclose a method for creating aluminum wirebond pad on a copper BEOL. The process comprises:

(a) forming a passivating layer on an integrated circuit (IC) semiconductor wafer containing Cu wiring embedded therein;

(b) forming terminal via openings through the passivation layer to expose the Cu wiring;

(c) forming a barrier layer at least over the exposed Cu wiring, on the side walls of the terminal via openings and on regions of the barrier layer near the terminal via openings;

(d) forming an Al stack on the barrier layer at least in the terminal via openings and on regions of the barrier layer near the terminal via openings;

(e) patterning and etching the Al stack and the barrier layer;

(f) forming a second passivating layer over the patterned Al stack; and (g) providing second openings in the second passivating layer so as to expose regions of the patterned Al stack located on top of the Cu wiring whereby the Cu wiring is protected from environmental exposure or attack by etching chemistries and from the problem of Cu-Al intermixing.

An integrated pad and fuse structure for planar copper metallurgy is disclosed in U.S. Pat. No. 5,795,819. The method of making the interconnection structure for the semiconductor circuit comprises:

providing a substrate having coplanar damascene non-self passivating conductors embedded in a first insulator defining a first electrical interconnect layer;

forming a second electrical interconnect layer comprising coplanar self-passivating conductors in a second insulator, the second electrical interconnect layer overlying the first electrical interconnect layer and the second interconnect self-passivating conductors contacting the non-self passivating conductors; and depositing a final passivation layer over the second electrical interconnect layer.

One of the non-self passivating conductors forms part of a Controlled, Collapse Chip Connection (C4) barrier structure, the method further comprising the steps of:

etching the final passivation layer above the C4 barrier structure; and depositing pad limiting and C4 metallurgies.

U.S. Pat. No. 6,054,380 disclose a method an apparatus for integrating low dielectric constant materials into a multilevel metallization and interconnect structure. The method comprises:

forming a metal line upon a surface of a substrate, where the metal line has a top surface and sidewalls;

depositing a barrier layer over the metal line and the surface of said substrate;

removing a portion of the barrier layer where the barrier layer remains deposited on at least the sidewalls of the metal line;

depositing a first insulative layer over said metal line, the surface of the substrate and the barrier layer, where the insulative layer is a material that, but for the barrier layer protecting the sidewalls of the metal line, would react with a material of the same metal line;

depositing a second insulative layer over the first insulative layer; and forming a via that contacts a top surface of the metal line.

There is a need in the art of preparing FEOL and BEOL processes in which Cu metallizations still rely on additional Al-wire bond pads to prepare an improvement of FBEOL structures that eliminate the additional patterning steps normally required for Al-via to Cu and Al-wire bond pads, in addition to the opening step required for final passivation.

SUMMARY OF THE INVENTION

One object of the present invention is to provide a process for fabricating a semiconductor device of a Cu far-back-end-of-the-line (FBEOL) structure comprising Cu metallizations wherein probing, bonding and fusing is accomplished with only one patterning step for the final passivation opening.

Another object of the present invention is to provide a process for fabricating a semiconductor device of a Cu far-back-end-of-the-line (FBEOL) structure comprising Cu metallization wherein probing, bonding, and fusing is accomplished together with flip chip bumping with two patterning steps.

A further object of the present invention is to provide a process for preparing Cu far-back-end-of-the-line (FBEOL) structures of Cu metallizations that eliminate the Al-via+Al-pad patterning.

DETAILED DESCRIPTION OF PREFERRED EMBODIMENT OF THE INVENTION

The invention will now be described in more detail with reference to the accompanying drawings, starting from a point where there is a multi-level Cu metallization either in combination with a conventional oxide or nitride or with low k-dielectrics such as Silk, Flare, Coral, SiCOH, or a porous low k material. In this case, at least the last Cu-layer must be embedded in a mechanically hard dielectric (e.g., oxide or FSG [fluorinated silicon glass]). Further, the last Cu layer must be thick enough to support the wire bonding process (approximately 500 nm or more). These last Cu-wirings, including the fuse-lengths are manufactured by state of the art damascene or dual damascene processes (i.e., patterning of the trenches and vias in the dielectric and filling it with liner, Cu seed layer, Cu-fill followed by an anneal and Cu CMP [chemical mechanical polishing]).

In general, the process sequence of the first embodiment is as follows:

providing a substrate having embedded copper wires and copper pads;
 selectively depositing a first metallic passivation layer on the top copper surfaces sufficient to prevent Cu oxidation and/or Cu out diffusion;
 depositing a final passivation layer;
 employing lithography and etching of the final passivation layer to affect pad opening and opening of the fuses by exposing the passivated Cu in the bond pad area and in the fuse area; and
 affecting an additional passivation of open pad and open fuse areas by selective immersion deposition of Au.

The process sequence of the second embodiment of the invention entails:

providing a substrate of a damascene copper pad and copper fuse embedded in a dielectric with a dielectric cap layer thereon;
 depositing a final passivation layer and affecting final passivation opening and fuse patterning with a lithographic and etching step;
 deposition of a liner (diffusion barrier) and copper seed layer, followed by Cu electroplating;
 immersion plating Au on top of Cu pads to create a surface sufficient for probing and bonding; and
 providing a dielectric layer sufficient to protect the fuses, but thin enough that the fuse can be blown through it.

Figure 1:
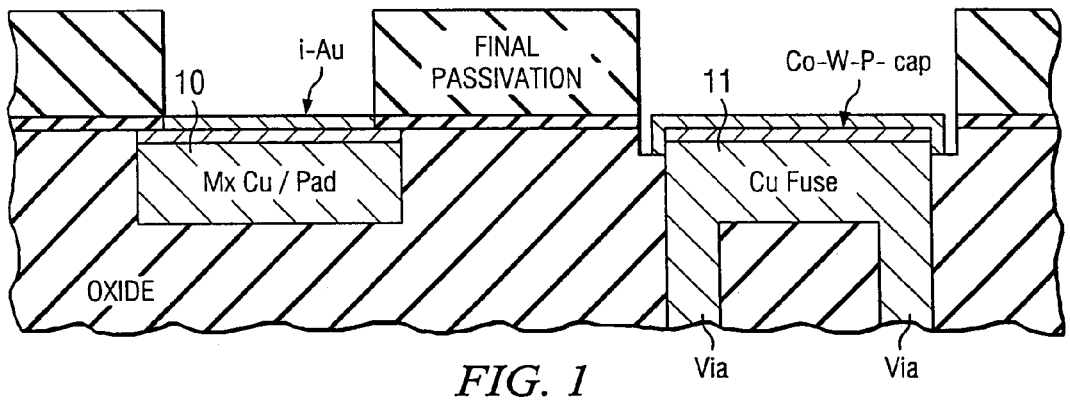
FIG. 1 depicts an integrated scheme for preparing the semiconductors of the invention in which there is probing, bonding and fusing utilizing only one patterning step for the final passivation opening in preparing i-Au passivated Cu-pads and Cu-laser fuses.

Referring now to FIG. 1, it may be seen that the integration scheme for preparing the semiconductor of the invention process commences with a multi-level Cu metallization in which a Cu or Cu alloy (MxCu) pad 10 and Cu fuse 11 are embedded in a dielectric substrate, the requirement being that at least the last Cu-layer must be embedded in the mechanically hard dielectric (e.g. oxide, FSG).

The multi-level Cu metallization may be in combination with a conventional oxide or nitride or a low k-dielectric (Silk, Flare, Coral, SiCOH, or other porous low K materials). The last Cu layer must also be thick enough to support the wirebonding process (approximately 500 nm or more). Further, the last Cu-wiring including the fuse-link may be manufactured in a state-of-the-art damascene or dual damascene process (i.e. patterning of the trenches and vias in the dielectric and filling it with liner, Cu-seed layer, Cu-fill followed by an anneal and Cu CMP).

Next, the top Cu surface is passivated against oxidation or Cu out diffusion by depositing a metallic passivation layer of either CoWP cap layer as shown in FIG. 1 or a layer of CoP or Ru. Optionally, deposition of a dielectric cap or etch stop layer such as SiN or Blok may be made at this point, whereupon the final passivation (using conventional PECVD oxide or nitride layers) is deposited.

A conventional patterning sequence utilizing lithography and etching is next employed on the final passivation to obtain the pad opening and the opening of the fuses. In this step, the passivated Cu is exposed in the bond pad area and also is the fuse area. In other words, the metallic passivation layer is needed on top of the Cu surface.

It is very important that each individual fuse link gets its individual opening in the final passivation. One large opening of the whole fuse area (which is the state of the art today) should be avoided. This is so because, during the laser fusing process, the splattered material should be redeposited at the vertical side wall of the final passivation in order to avoid a short of the neighboring fuse.

Additional preparation or passivation of the open metallic surfaces (i.e. open pad surface and open "naked" fuse) is accomplished by selective immersion deposition of Au. The finished structure creates a low resistive pad surface which allows easy probing and wirebonding.

The integration scheme of this first embodiment can be combined with the realization of inductors in the last Cu-level and also with a MIM-cap scheme. In order to make this integration process suitable for flip chip or C4 type of packages an additional thin (<200 nm because of fusing) layer of dielectric [e.g. oxide, nitride, photosensitive (low k or other) dielectric] may be deposited and patterned for the pad opening.

Figure 2:
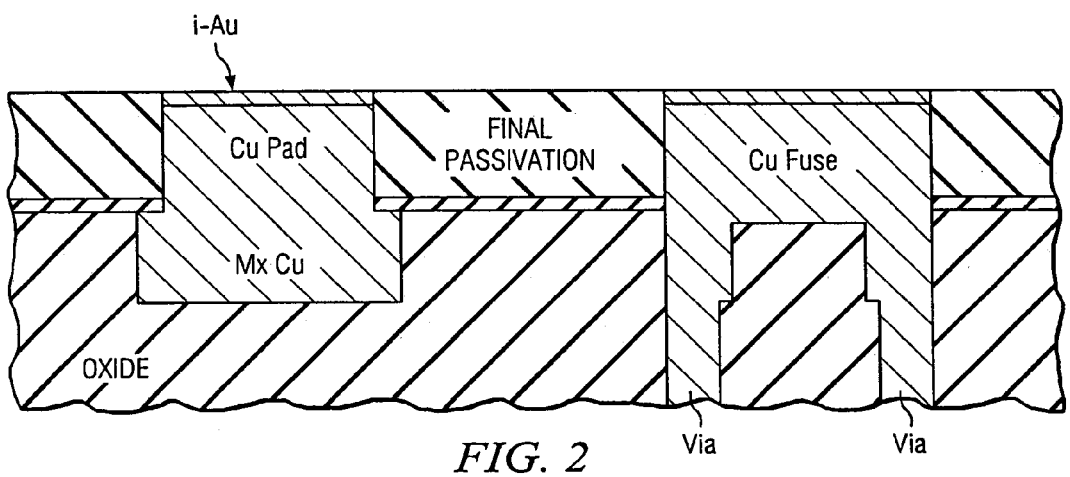
FIG. 2 depicts an integration scheme of the invention process in which there is probing, bonding and fusing, but also flip chip bumping utilizing two patterning steps to obtain Cu pads and fuses with i-Au finish.

In the integration scheme of the second embodiment of the invention process, as depicted in FIG. 2, Cu pads and fuses are shown with the immersion deposition of a Au (i-Au) finish; however, the last thin oxide protecting the fuse, but with openings of the pads is still missing. The starting point of the process of the second embodiment commences with a damascene Cu wiring in the last level embedded in the dielectric (e.g. oxide, FSG, and a nitride) with a typical dielectric cap layer (e.g. nitride or Blok). An important feature of this process is that the laser fuse link is not produced in the last metal, but only the two ends of the fuse are produced as landing pads. Final passivation is accomplished using an oxide or nitride, formed by final passivation opening and fuse patterning (on the whole fuse) with a single lithographic and etching step. Next, deposition of a liner (diffusion barrier) and a Cu seed layer is performed followed by a conventional Cu electroplating and CMP of the excess Cu and liner. Immersion deposition of Au (I-Au) is used to cause plating on top of the Cu pads to create a surface sufficient for probing and bonding. Thereafter, a thin layer of a dielectric (<200 nm) is deposited to protect the fuses so that the thinness is enough that the fuse can be blown through it. The packing of the thin dielectric layer is followed by a patterning step to affect the pad opening. Optionally, in the step of providing a finish with a thin dielectric layer, a thin photosensitive low k dielectric may be deposited for exposure and development to enable alleviating an etch process for the pad opening.

In the context of the invention, wherein the second embodiment is practiced, the process is very well suited for providing inductors (because thickening of the last Cu provides low resistance)and MIM can be easily integrated with a C4 or Flip Chip type of process (because the fuses are protected during the UBM and bumping process). However, the probing and fusing may be done after bumping. An additional benefit of the of the second embodiment of the invention is that all of the unblown fuses are protected by the last dielectric layer.

While the invention has been disclosed by reference to several preferred embodiments, many alterations can be made by those skilled in the art by way of modifications without departing from the spirit and scope of the invention, which is defined by the appended claims.

We claim:

1. A process of making an interconnection structure of Cu FBEOL (FAR-BACK-END-OF LINE) semiconductor devices that does not rely upon Al-wirebond pads which require additional patterning steps (for Al-via to Cu or Al-pad patterning), comprising:
    a) providing a substrate having Cu fuses and Cu or Cu alloy pads embedded therein;
    b) selectively depositing a first metallic passivation layer on top copper surfaces of said Cu fuses and Cu or Cu alloy pads sufficient to prevent Cu oxidation and/or Cu out diffusion;
    c) depositing a final passivation layer;
    d) employing lithography and etching of said final passivation layer to cause pad opening of the fuses by exposing the passivated Cu in the bond pad area and in the fuse area; and
    e) causing additional passivation of open pad and open fuse areas by selective immersion deposition of Au.

2. The process of claim 1 wherein between steps b) and c) a dielectric cap or etchstop layer is deposited.

3. The process of claim 2 wherein said dielectric cap or etchstop layer is SiN.

4. The process of claim 1 wherein said first metallic passivation layer in step b) is selected from the group consisting of CoWP, CoP and Ru.

5. The process of claim 1 wherein said final passivation in step c) is by PECVD of oxide or nitride layers.

6. A process of making an interconnection structure of Cu FBEOL semiconductor devices that does not rely upon Al-wirebond pads which require additional patterning steps (for Al-via to Cu, Al-pad), comprising:
    a) providing a substrate of a damascene Cu pad and Cu fuse embedded in a dielectric with a dielectric cap layer thereon;
    b) depositing a final passivation layer and affecting final passivation opening and fuse patterning with a lithographic and etching step;
    c) depositing a liner (diffusion barrier) and Cu seed layer, followed by Cu electroplating;
    d) immersion plating Au on top of Cu pads to create a surface sufficient for probing and bonding; and
    e) providing a dielectric layer sufficient to protect the fuses, but thin enough that the fuse can be blown through it.

7. The process of claim 6 wherein said cap layer is a nitride.

8. The process of claim 6 wherein in step b) said final passivation layer is selected from the group consisting of an oxide or nitride.

9. An interconnection structure of a Cu FBEOL (FAR-BACK-END-OF LINE) semiconductor device that is free from inclusion of Al-wirebond pads that require additional patterning steps (for Al-via to Cu or Al-pad patterning), comprising:
    a) a substrate having Cu open fuse areas and Cu or Cu alloy open pad areas embedded therein;
    b) a first metallic passivation layer deposited on top surfaces of said Cu open fuse areas and Cu or Cu alloy open pad areas to prevent Cu oxidation and/or Cu out diffusion, and a final passivation layer disposed on top of said first passivation layer; and
    d) an additional passivation layer of Au in Cu or Cu alloy open pad areas and Cu open fuse areas of said structure obtained by lithography and etching of said final passivation layer to affect pad opening of the bond pad and fuse areas under said final passivation layer.

10. The interconnection structure of claim 9 wherein a dielectric or etchstop layer is disposed between said first metallic passivation layer and said final passivation layer.

11. The interconnection structure of claim 10 wherein said dielectric cap or etchstop layer is SiN.

12. The interconnection structure of claim 9 wherein said first metallic passivation layer is selected from the group consisting of CoWP, CoP and Ru.

13. The interconnection structure of claim 9 wherein said final passivation layer is an oxide or nitride formed by PECVD.

14. An interconnection structure of a Cu FBEOL semiconductor device that is free from inclusion of Al-wirebond pads that require additional patterning steps (for Al-via to Cu, Al pad), comprising:
    a) a substrate having a damascene Cu pad and Cu fuse embedded therein;
    b) a dielectric layer and a cap layer disposed on said dielectric layer;
    c) a final passivation layer deposited on said cap layer with final passivation opening and fuse patterning from a lithographic and etching step;
    d) a barrier liner (diffusion barrier) and Cu seed layer deposited respectively on said final passivation layer and a Cu electroplated layer deposited on said Cu seed layer;
    e) a Au plating layer deposited on top of said Cu pads to create a surface sufficient for probing and bonding; and
    f) a dielectric layer disposed on said fuse that is sufficient to protect said fuse, but thin enough to enable said fuse to be blown through it.

15. The interconnection structure of claim 14 wherein said cap layer is a nitride.

16. The interconnection structure of claim 14 wherein said final passivation layer is selected from the group consisting of an oxide or nitride.

* * * * *